(12) United States Patent
Aziz et al.

(10) Patent No.: US 8,761,237 B2
(45) Date of Patent: Jun. 24, 2014

(54) LOW NONLINEAR DISTORTION VARIABLE GAIN AMPLIFIER

(75) Inventors: Pervez M. Aziz, Dallas, TX (US); Hiroshi Kimura, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 13/288,096

(22) Filed: Nov. 3, 2011

(65) Prior Publication Data

US 2013/0114665 A1    May 9, 2013

(51) Int. Cl.
*H03H 7/30* (2006.01)
*H03H 7/40* (2006.01)
*H03K 5/159* (2006.01)

(52) U.S. Cl.
USPC ........................................................ 375/229

(58) Field of Classification Search
USPC ........................................................ 375/229
See application file for complete search history.

(56) References Cited

U.S. PATENT DOCUMENTS

| | | | | |
|---|---|---|---|---|
| 4,275,358 A * | 6/1981 | Winget | | 330/109 |
| 5,465,072 A | 11/1995 | Atarodi | | |
| 6,043,570 A * | 3/2000 | Kurata et al. | | 307/109 |
| 7,154,945 B2 | 12/2006 | Guinea et al. | | |
| 7,200,371 B1 * | 4/2007 | Huffstetler, Jr. | | 455/127.2 |
| 7,656,227 B1 | 2/2010 | Beaudoin et al. | | |
| 8,174,318 B2 * | 5/2012 | Balboni | | 330/253 |
| 2003/0128071 A1 | 7/2003 | Nguyen et al. | | |
| 2005/0258904 A1 * | 11/2005 | Mehr | | 330/305 |
| 2006/0245485 A1 | 11/2006 | Martin et al. | | |
| 2008/0284505 A1 | 11/2008 | Okada | | |

OTHER PUBLICATIONS

Aziz, Pervez M. and Malipatil, Amaresh V.; Adaptation Algorithms for a Class of Continuous Time Analog Equalizers with Application to Serial Links; IEEE 2011.

Choi, Jong-Sang, Hwang, Moon-Sang and Jeong, Deog-Kyoon; A 0.18-μm CMOS 3.5Gb/s Continuous-Time Adaptive Cable Equalizer Using Enhanced Low-Frequency Gain Control Method; IEEE Journal of Solid-State Circuits; Mar. 2004; vol. 39, No. 3.

* cited by examiner

*Primary Examiner* — Chieh M Fan
*Assistant Examiner* — Tanmay Shah

(57) ABSTRACT

A variable gain amplifier (VGA) useful in a receiver that recovers transmitted digital signals. A first amplifier in the VGA has a first gain, an input coupled to an input of the VGA, and an output coupled to a load. A second amplifier in the VGA has a second gain, an input coupled to the input of the VGA, and an output coupled to the load. In a first mode of operation, the first gain is substantially zero and the second gain ranges between a maximum gain and a fraction of the maximum gain. In a second mode of operation the first gain is substantially the maximum gain and the second gain ranges between the maximum gain and the fraction of the maximum gain, and an algebraic sum of the first gain and second gain is no greater than the maximum gain to reduce non-linear distortion at low VGA gain.

29 Claims, 4 Drawing Sheets

LOW NONLINEAR DISTORTION VARIABLE GAIN AMPLIFIER

BACKGROUND

Communication receivers that recover digital signals must sample an analog waveform and then reliably detect the sampled data. Signals arriving at a receiver are typically corrupted by intersymbol interference (ISI), crosstalk, echo, and other noise. As data rates increase, the receiver must both equalize the channel, to compensate for such corruptions, and detect the encoded signals at increasingly higher clock rates. Decision-feedback equalization (DFE) is a widely used technique for removing intersymbol interference and other noise at high data rates. For a detailed discussion of decision feedback equalizers, see, for example, *Digital Communication Principles* by R. Gitlin et al (Plenum Press 1992) and *Digital Communications* by E. A. Lee and D. G. Messerschmitt (Kluwer Academic Press, 1988), each incorporated by reference herein in their entirety.

Generally, decision-feedback equalization utilizes a nonlinear equalizer to equalize the channel using a feedback loop based on previously detected (or decided) data. In one typical DFE implementation, a received analog signal is sampled after DFE correction and compared to one or more thresholds to generate the detected data. The DFE correction, is subtracted in a feedback fashion to produce a DFE-corrected signal. A clock, generated from the received signal by a Clock and Data Recovery (CDR) circuit, is generally used to sample the DFE-corrected signal and for the DFE operation. An example of such a receiver is disclosed in "Method and Apparatus for Generating One or More Clock Signals for a Decision-Feedback Equalizer Using DFE Detected Data", by Aziz et al, U.S. Pat. No. 7,616,686, incorporated by reference herein in its entirety. The receiver described in the patent utilizes a DFE-based phase detection architecture for clock and data recovery of a DFE equalized signal.

A DFE-based receiver usually includes an analog front end (AFE), typically having an adjustable gain amplifier (AGA) used to control the input signal level, and an equalizer used to compensate for linear, frequency-based distortions in the input signal to the receiver. The equalizer (also referred to herein as a continuous time linear equalizer or CTLE) is generally implemented as an analog-based filter with at least one adjustable coefficient or peaking parameter that can at least partially compensate for linear distortions in the received signal. For example, high frequency portions of the received signals might be attenuated as the signals pass through a transmission line, rounding off what are otherwise sharp, square-wave signals as originally transmitted. The CTLE's coefficients or peaking parameters, in response to a controller within the receiver, are adjusted to add gain to the high frequency components of the signal, referred to herein as "peaking", to at least partially restore the received signal to its original shape. However, the analog circuitry in the AFE might have inherent limitations, one of which is the amount of nonlinear distortion introduced onto the received signal by various analog circuits in the AFE. Any distortion introduced by the AFE can seriously degrade performance of the overall receiver. For example, should one or more amplifiers in the AFE begin to saturate, i.e., limit signals into or out of the amplifiers, nonlinear distortion of the input signal results. Conversely, an analog amplifier widely used in CTLE implementations can generate significant nonlinear distortion when the amplifier is operating at low gain.

Thus, it is desirable to provide a variable gain amplifier design, useful in a CTLE applications or the like, that does not cause significant nonlinear distortion at low gain.

SUMMARY

In one embodiment of the invention, an integrated variable gain amplifier having a load, coupled to an output of the variable gain amplifier, and first and second amplifiers. The first amplifier has a first gain, an input coupled to an input of the variable gain amplifier, and an output coupled to the load. The second amplifier has a second gain, an input coupled to the input of the variable gain amplifier, and an output coupled to the load. In a first mode of operation, the first gain is substantially zero and the second gain ranges between a maximum gain and a fraction of the maximum gain. In a second mode of operation the first gain is substantially the maximum gain and the second gain ranges between the maximum gain and the fraction of the maximum gain, and an algebraic sum of the first gain and second gain is no greater than the maximum gain.

In another embodiment of the invention, a receiver has an analog equalizer. The equalizer has a first filter, a second filter, a first amplifier, and a second amplifier. The first filter is coupled between an input and an output of the equalizer. The second filter is coupled between the input of the equalizer and a node. The first amplifier has a first gain, an input coupled to the node, and an output coupled to the output of the equalizer. The second amplifier having second gain, an input coupled to the node, and an output coupled to the output of the equalizer. In a first mode of operation, the first gain is substantially zero and the second gain ranges between a maximum gain and a fraction of the maximum gain. In a second mode of operation, the first gain is substantially the maximum gain and the second gain ranges between the maximum gain and the fraction of the maximum gain, and an algebraic sum of the first gain and second gain is no greater than the maximum gain.

In still another embodiment of the invention, a method of amplifying a signal by amplifying the signal using a first amplifier having a first gain, amplifying the signal using a second amplifier having second gain; and subtracting the amplified signal from the second amplifier from the amplified signal from the first amplifier. In a first mode of operation the first gain is substantially zero and the second gain ranges between a maximum gain and a fraction of the maximum gain, and in a second mode of operation the first gain is substantially the maximum gain and the second gain ranges between the maximum gain and the fraction of the maximum gain.

BRIEF DESCRIPTION OF THE DRAWINGS

Aspects and features of embodiments of the invention will become more fully apparent from the following detailed description, the appended claims, and the accompanying drawings in which like reference numerals identify similar or identical elements.

DETAILED DESCRIPTION

In addition to the patents referred to herein, each of the following patents and patent applications are incorporated herein in their entirety:

U.S. Pat. No. 7,599,461, titled "Method and Apparatus for Generating One or More Clock Signals for a Decision-Feedback Equalizer Using DFE Detected Data in the Presence of an Adverse Pattern", by Aziz et al.

U.S. patent application Ser. No. 12/776,681, titled "A Compensated Phase Detector for Generating One or More Clock Signals Using DFE Detected Data in a Receiver", by Aziz et al.

As data rates increase for serializer/deserializer (SERDES) applications, the channel quality degrades. Decision feedback equalization (DFE) in conjunction with a finite impulse response (FIR) filter in a transmitter (TX) and a receiver equalizer within a receiver (RX) is generally used to achieve the bit error rate (BER) performance needed for reliable communications. It is understood that the FIR function of the transmitter can be moved from the transmitter to the receiver and incorporated into the receiver's analog front end (AFE).

Figure 1:
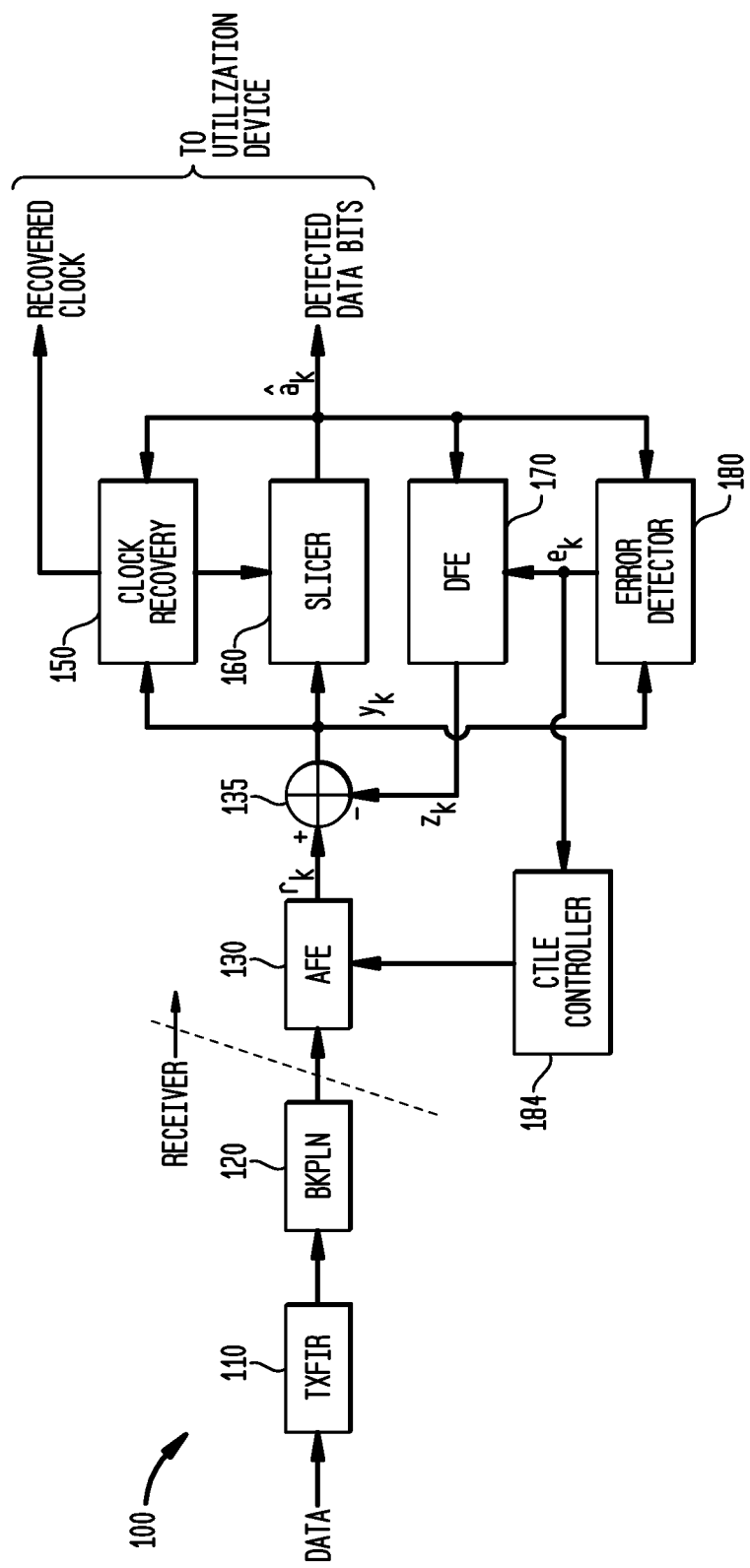
FIG. 1 is a simplified block diagram of a serializer/deserializer (SERDES) communication channel having a receiver incorporating an analog front end (AFE) and a DFE-based equalizer.

FIG. 1 is a block diagram of a typical SERDES communication channel 100 that incorporates a traditional DFE-based equalizer in addition to the TX and RX equalization. As shown in FIG. 1, the data is transmitted through a backplane channel 120 after optionally being equalized or filtered through a transmit FIR filter (TXFIR) 110. After passing through the backplane (BKPLN) 120, metal traces in a substrate (not shown), a cable (not shown), or a combination thereof, the analog signal may optionally be filtered or equalized by an analog front end (AFE) 130 having an variable gain amplifier (not shown) for amplitude control and may include, for example, a continuous-time filter. The analog signal output $r_k$ of the AFE 130 passes through subtractor 135, used in conjunction with an decision feedback equalizer (DFE) 170 having L taps and described below, and is then sampled by a clock/data recovery (CDR) circuit 150. A slicer 160 (described below) digitizes the output $y_k$ of the subtractor 135 by comparing the sample to an exemplary threshold of zero in response to the data clock generated by the CDR 150 and latches the result.

A conventional slicer 160 can be implemented as a slicer-latch (i.e., a decision device based on an amplitude threshold and a latch to hold the results of the decision device) or a more complicated detector such as a sequence detector. For high-speed applications, the slicer 160 is often implemented as a slicer-latch that is clocked by a CDR-generated clock. In addition to sampling the data signal, the slicer 160 essentially quantizes the signal to a binary "1" or "0" based on the sampled analog value and a slicer threshold, $s_t$. If the input to the slicer 160 at time k is $y_k$, then the detected data bit output, $â_k$ of the slicer 160 is given as follows:

$$â_k = 1 \text{ if } y_k > s_t$$
$$= 0 \text{ otherwise.}$$

In this embodiment, the slicer 160 has a slicer threshold $s_t$ of zero. In other embodiments, the binary representations of the quantized signal could be reversed, or the slicer threshold $s_t$ could be nonzero. The phase of the analog waveform is typically unknown and there may be a frequency offset between the frequency at which the original data was transmitted and the nominal receiver sampling clock frequency. The function of the CDR 150 is to properly sample the analog waveform such that when the sampled waveform is passed through a slicer 160, the data is recovered properly despite the fact that the phase and frequency of the transmitted signal is not known. The CDR 150 may be conventional and is often an adaptive feedback circuit where a feedback loop adjusts the phase and frequency of the nominal clock to produce a modified recovered clock that can sample the analog waveform to allow proper data detection.

In general, the CDR 150 may be composed of several components, such as a phase detector, a loop filter, and a clock generation circuit (not shown). In one embodiment, the CDR 150 comprises a bang-bang phase detector (BBPD). For a general discussion of bang-bang phase detectors, see, for example, J. D. H. Alexander, "Clock Recovery from Random Binary Signals," Electronics Letters, 541-42 (October, 1975), incorporated by reference herein in its entirety. Alternatively, the CDR 150 comprises a Mueller-Muller CDR where the signals are sampled at the baud-rate. For a general discussion of Mueller-Muller CDR, see, for example, K. Mueller and K. Muller, "Timing Recovery in Digital Synchronous Data Receivers," IEEE Trans. Comm., Vol. 24, No. 5, May 1976, pp. 516-531, incorporated by reference herein in its entirety.

Exemplary operation of L-tap DFE 170 in FIG. 1 is well known and explanation of the filter 170 and alternative embodiments thereof may be found in the above-referenced patent application by Aziz et al, titled "A Compensated Phase Detector for Generating One or More Clock Signals Using DFE Detected Data in a Receiver". For purposes here, a DFE correction, $z_k$, is generated by a DFE filter 170 in response to an error signal $e_k$ from error detector 180, and is subtracted by an analog summer 135 from the output, $r_k$, of the AFE 130 to produce a DFE corrected signal $y_k$, where $y_k = r_k - z_k$. Then the DFE-corrected signal $y_k$ is detected by the slicer 160 to produce the detected data bits $â_k$.

Figure 2:
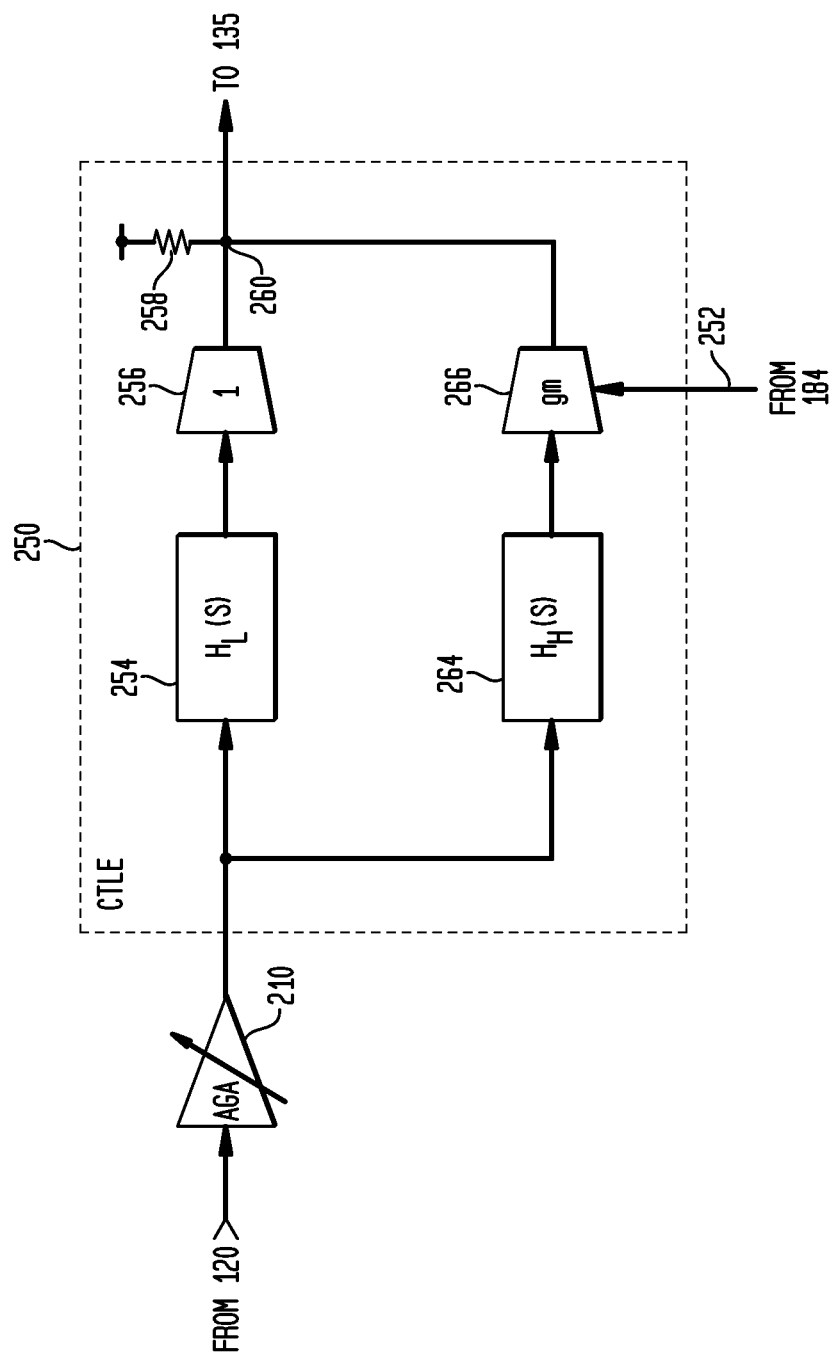
FIG. 2 is a simplified block diagram of an implementation of the analog front end (AFE) of the receiver shown in FIG. 1.

FIG. 2 diagrams the details of an exemplary AFE 130. In this embodiment, an adjustable gain amplifier (AGA) 210 receives input signals from the backplane 120 (FIG. 1). The AGA 210 has an adjustable gain input (not shown) that may be analog or digital in nature. The output of the AGA drives a continuous-time linear equalizer (CTLE) 250 that is well known in the art. In this prior art example, the CTLE 250 has an input 252 that allows for adjustment of one coefficient in the CTLE 250 by changing the coefficient or gain of a transconductance amplifier 266. A change in the coefficient of the CTLE 250 will change the frequency-dependent characteristics of the received signals. In one prior art embodiment and as will be described in more detail below, the CTLE 250 varies the amount of high-frequency peaking in the signal from AGA 210 in response to a coefficient value control signal on input 252. Thus, by asserting the appropriate coefficient value on input 252, the CTLE 250 will at least partially compensate for dispersion and other frequency-dependent distortions due to the transmission path in the backplane 120. A controller described below determines the coefficient control signal value.

Returning to FIG. 1, the error signal $e_k$ is generated by a conventional error detector 180 taking the difference between the DFE-corrected signal $y_k$ and the detected data bits $â_k$. A controller 184, responsive to the error signal $e_k$, generates the coefficient control signals for adjusting the one or more coefficient values of the CTLE 250 (FIG. 2) and can also generate AGA gain control settings (not shown) for the AGA 210 (FIG.

2). During the training or adaptation phase by the receiver (not numbered), the controller 184, responsive to the error signal $e_k$, converges one or more coefficient values of the CTLE 250 either to reduce intersymbol interference during eye openings or to reduce signal transition jitter. An exemplary technique for adapting the AGA and CTLE is described in "Adaptation Algorithms for a Class of Continuous Time Analog Equalizers With Application to Serial Links", by P. M. Aziz and A V. Malipatil, Proceedings of the 2011 IEEE International Symposium on Circuits and Systems (ISCAS 2011), pp. 1383-1386, included by reference herein in its entirely. Alternatively, the CTLE 250 may be manually configured by a user setting the coefficient values for the CTLE 250 or by using predetermined coefficient values.

Returning to FIG. 2, the analog signal from the AGA 210 is applied concurrently to two filters 254 and 264. Filter 254 has a transfer function of $H_L(s)$ and filter 264 has a transfer function of $H_H(s)$. Ignoring any parasitic poles that might exist in a physical embodiment of the filters (the parasitic poles are typically have a second order low-pass characteristic and are ignored for purposes here), generally filter 254 simply passes the input signal unchanged ($H_L(s)=1$) and filter 264 is a first-order high-pass filter ($H_H(s)=s(s+\alpha)^{-1}$, where a is a cutoff frequency of the filter 264, or "poles", expressed in units of radians). The amplitude of signals from the filters 254 and 264 are adjusted (weighted) by transconductance amplifiers 256 and 266, respectively, and the amplified signals are summed together across load resistor 258 at node 260. In a typical prior art embodiment, the amplifiers 256 and 266 are conventional transconductance amplifiers, also known as voltage-controlled current sources, and are well known in the art. Because the amplifiers 256 and 266 amplify a voltage signal applied to the inputs thereof and produce output current proportional to the input voltage multiplied by the transconductance of the respective amplifier, load resistor 258 combines and converts (according to Ohm's law) the output currents into a combined output voltage for transmission to subtractor 135 (FIG. 1). In this example, the transconductance of amplifier 256 is substantially unity (i.e., the amplitude of the output signal on node 260 in response to an input signal to amplifier 256 is approximately the same as the amplitude of that input signal) and the transconductance ($g_m$) of amplifier is variable in response to the transconductance coefficient gain control signal K from controller 184 (FIG. 1) on input 252. If the gain K of transconductance amplifier 266 is greater than zero, a high-frequency emphasis or "peaking" in the signal from AGA 210 occurs in the output signal on node 260, the amount of peaking depending on the gain control signal K applied to amplifier 266. Thus, by asserting the appropriate coefficient or gain value on input 252, the CTLE 250 will at least partially compensate for dispersion and other frequency-dependent distortions due to the transmission path in the backplane 120.

By the nature of how a transconductance amplifier operates and how the gain of the amplifier is determined by controlling the amount of operating current provided to the amplifier, a transconductance amplifier might generate a considerable amount of nonlinear distortion at low gain. This is due generally to non-ideal operation of transistors at low operating currents. The amount of distortion might be severe enough to reduce the performance, e.g. a slower data rate or higher error rate than would otherwise be expected, of the overall communications channel 100. Ironically, when the input signals to the receiver from the backplane 120 are nearly ideal (requiring just a little peaking), the distortion caused by the transconductance amplifier 266 (FIG. 2) operating with low gain may degrade the receiver's performance more than the receiver degrades when receiving poor quality signals (requiring a large amount of peaking) from the backplane 120.

Figure 3:
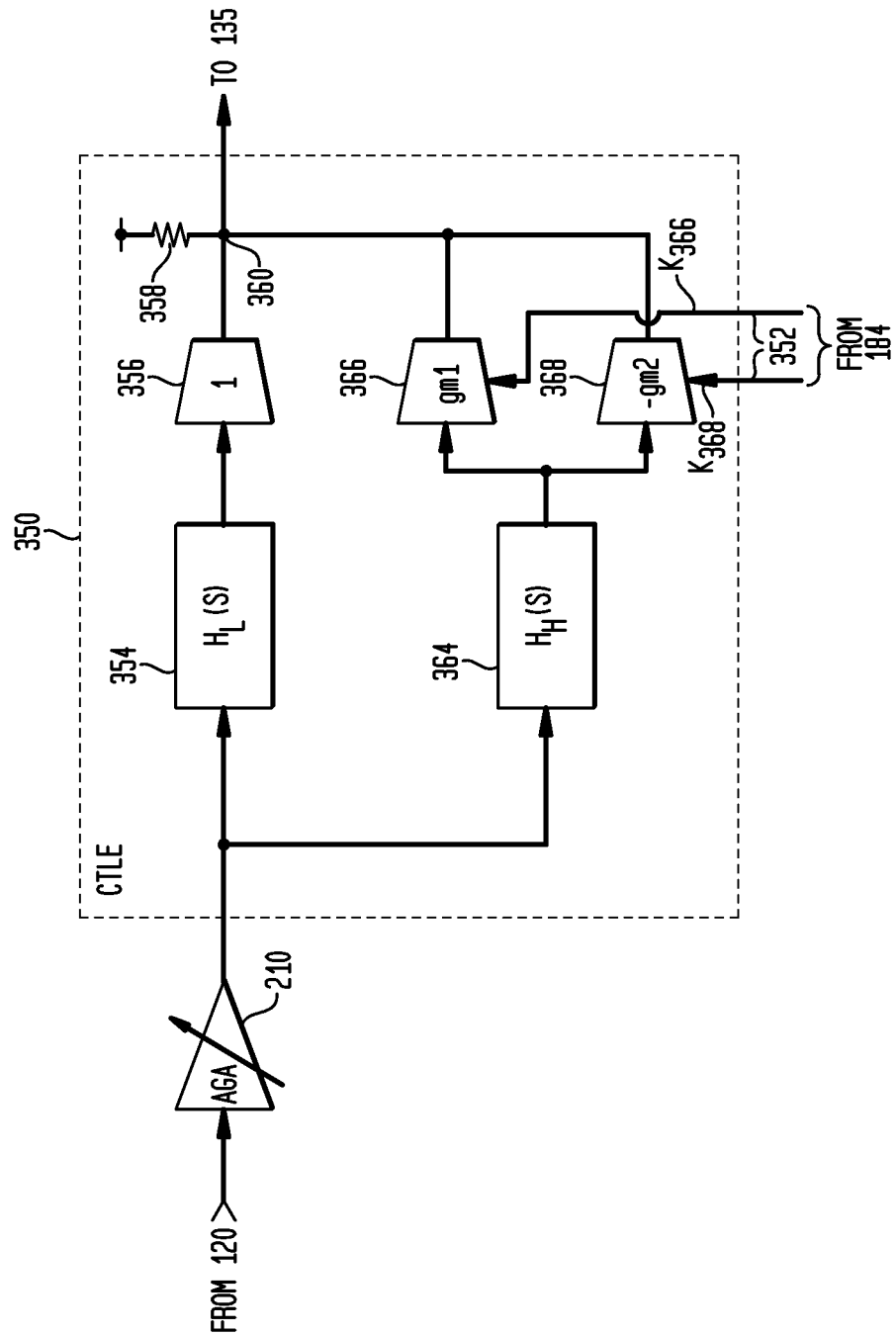
FIG. 3 is a simplified block diagram of the analog front end (AFE) of the receiver shown in FIG. 1 according to one embodiment of the invention.

To address the distortion caused by the transconductance amplifier 266 at low K gain settings, a variable gain amplifier formed from a combination of transconductance amplifiers 366, 368 is used in a CTLE 350 of FIG. 3 to replace the single variable gain transconductance amplifier 266 of FIG. 2. For purposes here, the filters 354 and 364 are substantially the same as the filters 254 and 264, respectively, in FIG. 2 and as described above. Further, amplifier 356 and load 358 are substantially the same as amplifier 256 and load 258 in FIG. 2 and as described above, Amplifier 266 (FIG. 2) is replaced with paralleled amplifiers 366 and 368. Generally, neither amplifier operates at low gain to avoid, generating the low gain nonlinear distortion described above and can provide the same full range of gain settings possible by the amplifier 266 (FIG. 2), e.g., ranging from approximately no (essentially zero) gain to a maximum gain. This is achieved generally and in this embodiment by having amplifier 366 operate in a range from approximately one-half the maximum gain to the maximum gain with amplifier 368 turned off, or with amplifier 366 operating at the maximum gain and amplifier 368 operating in a range between one-half the maximum gain and the maximum gain, but inverting or providing an opposite output signal phase compared to that of amplifier 366 (represented as the transconductance $-g_m$ for amplifier 368), the maximum gain for amplifiers 266, 366, and 368 being approximately the same. Expressed mathematically, the overall transfer function of the CTLE 350 is $H_L(s)+(K_{366}-K_{368})H_H(s)$, where $K_{366}$ and $K_{368}$ are the transconductance gains of the amplifiers 366 and 368, respectively. Using the combined gain of the amplifiers as K ($K=K_{366}-K_{368}$), and Km is the maximum gain available from either of the amplifiers, the amplifiers 366 and 368 are configured to operate as follows:

in one operating mode where $0 \leq K \leq Km/2$, set the gain of amplifier 366 to Km ($K_{366}=Km$) and the gain of amplifier 368 to Km−K ($K_{368}=Km-K$) such that $Km/2 < K_{368} \leq Km$; and in another operating mode, where $Km/2 \leq K \leq Km$, set the gain of amplifier 366 to K ($K_{365}=K$) and the gain of amplifier 368 to zero ($K_{368}=0$). Thus, no amplifier is operated with a gain of less than Km/2 except when $K_{368}=0$, where the amplifier 368 is effectively turned off. Gain breakpoints Kb that are a fraction of Km other than Km/2 may be used, such as Km/3 or 0.7 Km but the minimum gain (Kmin) of either amplifier should be sufficient to assure that no substantial nonlinear distortion occurs over the desired range of the combined gain K. Expressing the foregoing mathematically, the gain breakpoint Kb ranges between greater than Kmin (since Kmin is greater than zero) and Km (i.e., Kmin<Kb<Km). Substituting Kb for Km/2 in the above gain inequalities, the gain of amplifier 368 ($K_{368}$) is $Kb \leq K_{368} \leq Km$ in the operating mode where $0 \leq K \leq Kb$ or, after substituting the above range for Kb, Kmin<$K_{368}$≤Km. Similarly, the gain of the amplifier 366 is $K_{366}=K$ in the operating mode where Kb≤K≤Km or, after substituting the above range for Kb, Kmin<$K_{366}$≤Km.

Controller 184 (FIG. 1) sets the gain of each of the amplifiers 366 and 368 in accordance with the above-described gain setting requirements via input 352. The gain control signals from controller 184 may be analog or in digital form.

The transfer function of the filters 354 and 364 in this embodiment may be low-pass and high-pass, respectively, as is well known in the art. In other embodiments, either filter can be a bandpass filter, all-pass filter, etc., or a combination thereof. The filters may have Butterworth, Chebyshev, Sallen-Key, or other filter characteristics as desired and each may have an order greater than or equal to one.

Figure 4:
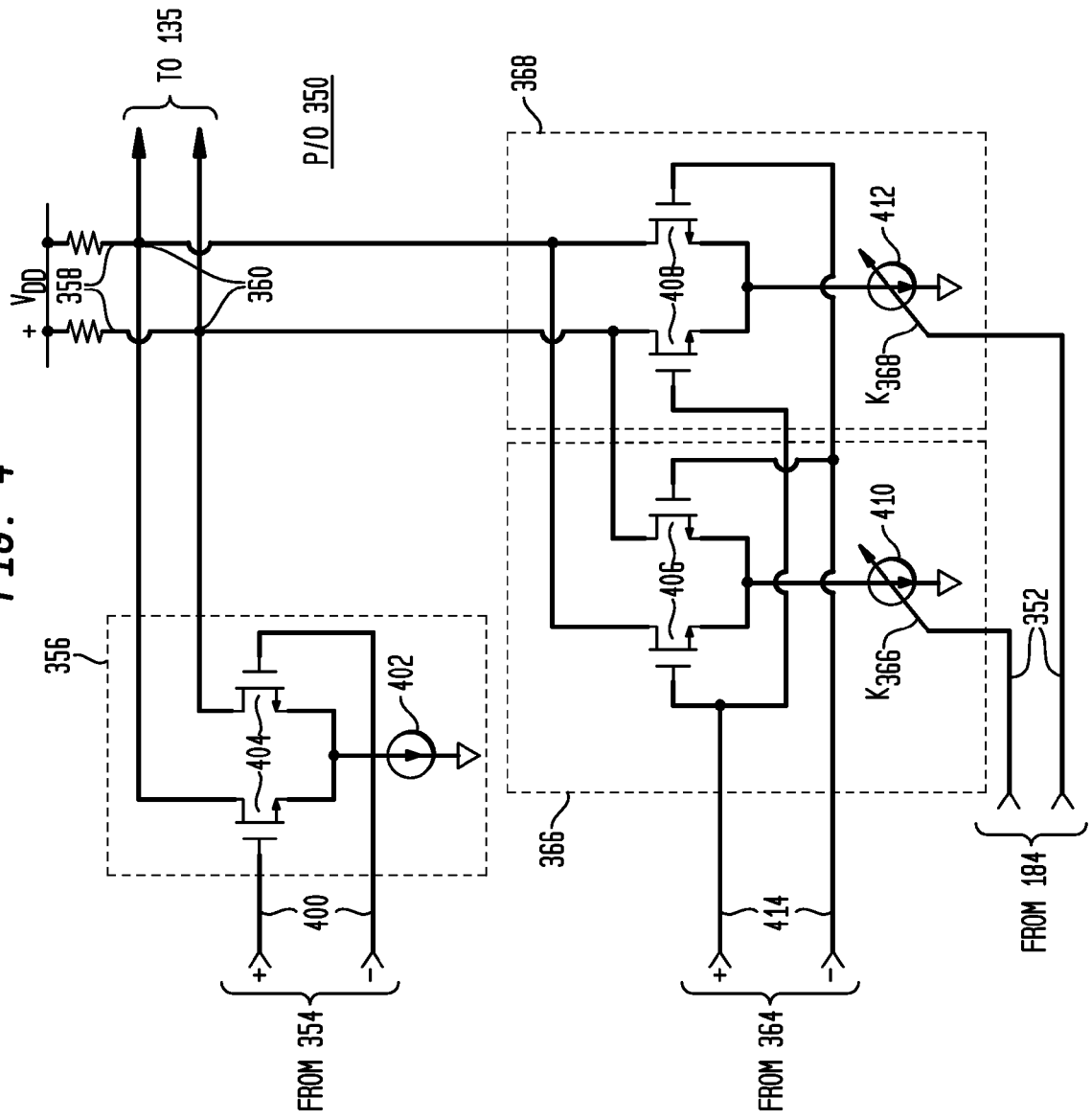
FIG. 4 is a simplified circuit diagram illustrating an exemplary embodiment of the continuous time linear equalizer (CTLE) portion in FIG. 3 showing additional circuit details.

FIG. 4 illustrates one embodiment of the amplifiers 356, 366, and 368 of CTLE 350 (FIG. 3). In this example, amplifier 356 is shown as a differential amplifier receiving a signal from filter 354 on differential input 400. Gain of the amplifier 356 is set by a "tail current" supplied by current source 402 connected to sources of FET differential pair 404. Drains of the differential pair 404 connect to differential load resistors 358 at output nodes 360. In this embodiment, the gain of amplifier 356 is unity, i.e., no substantial amplitude change occurs for a differential signal on input 400, amplified by amplifier 356, and coupled to node 360. It is understood that another gain value other than unity gain may be used or the gain may be adjustable as desired.

Amplifiers 366 and 368 in this embodiment are also shown as differential amplifiers using FET differential pairs 406 and 408, respectively. The gains of the amplifiers 366 and 368 are controlled by tail currents supplied by variable current sources 410 and 412, respectively. The current sources 410 and 412 may be controlled with analog signals or digital signals as is well known in the art. The amplifiers 356 and 366 have the same phase, i.e., a positive differential input signal to either amplifier will result in a differential output signal with the same phase at node 360. However, amplifier 368 is shown with opposite phase, or inverted, interconnection between positive and negative differential inputs 414 and differential output nodes 360 compared to amplifier 366. Thus, amplifier 368 provides an opposite phase or inverted signal to output nodes 360 compared to amplifier 366. In other embodiments, other types of transistors, such as bipolar transistors, may be substituted for FET pairs 404, 406, and 408 as desired. It is understood that the exemplary variable gain amplifier arrangement described above is useful in variable gain amplifier applications other than in a CTLE, e.g., for the AGA 210 of FIGS. 2 and 3. Further, while the CTLE implemented in FIG. 4 is fully differential, in other embodiments some or all of the CTLE can be implemented using single-ended (non-differential) circuitry. While the invention is described in connection with variable transconductance amplifiers, it is also believed that the invention may be applied in other embodiments to non-transimpedance variable amplifiers to reduce distortion at low gain values.

For purposes of this description and unless explicitly stated otherwise, each numerical value and range should be interpreted as being approximate as if the word "about" or "approximately" preceded the value of the value or range. Further, signals and corresponding nodes, ports, inputs, or outputs may be referred to by the same name and are interchangeable. Additionally, reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the terms "implementation" and "example."

Also for purposes of this description, the terms "couple," "coupling," "coupled," "connect," "connecting," or "connected," refer to any manner known in the art or later developed in which a signal is allowed to be transferred between two or more elements and the interposition of one or more additional elements is contemplated, although not required. Conversely, the terms "directly coupled," "directly connected," etc., imply the absence of such additional elements.

It is understood that various changes in the details, materials, and arrangements of the parts which have been described and illustrated in order to explain the nature of this invention may be made by those skilled in the art without departing from the scope of the invention as expressed in the following claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The invention claimed is:

1. In an integrated circuit, an equalizer having an input and an output, the equalizer comprising:
    a load coupled to the output of the equalizer;
    a first amplifier having a first gain, an input coupled to the input of the equalizer, and an output coupled to the load; and
    a second amplifier having a second gain, an input coupled to the input of the equalizer, and an output coupled to the load;
    wherein, in a first mode of operation the second gain is substantially zero and the first gain ranges between a maximum gain Km and a gain breakpoint Kb,
    wherein in a second mode of operation the first gain is substantially the maximum gain and the second gain ranges between the maximum gain Km and the gain breakpoint Kb, wherein the combined gain of the first and second amplifiers applied to the load in the first mode is between Kb and Km and the combined gain in the second mode is between 0 and Kb, and
    wherein the gain breakpoint Kb is less than the maximum gain and greater than zero.

2. The integrated circuit of claim 1, wherein the gain breakpoint Kb is approximately one-half the maximum gain Km.

3. The integrated circuit of claim 1, wherein the output of the second amplifier is coupled to the load in a phase opposite to that of the first amplifier.

4. The integrated circuit of claim 1, wherein the first and second amplifiers each have a differential amplifier responsive to respective first and second tail currents that controls the respective gain of the first and second amplifiers.

5. The integrated circuit of claim 4, wherein the tail currents are digitally controlled.

6. The integrated circuit of claim 1, wherein the load includes a resistor.

7. The integrated circuit of claim 6, wherein the first and second gains are first and second transconductances of the first and second amplifiers, respectively, and the maximum gain is a maximum transconductance of the second amplifier, and the variable gain amplifier has a voltage gain determined by an algebraic combination of the transconductance of the first and second amplifiers multiplied by the impedance of the load.

8. The integrated circuit of claim 1, wherein the equalizer has differential inputs and outputs, the first and second amplifiers are differential amplifiers, and the load includes two resistors coupled between a voltage supply line and corresponding conductors of the differential output.

9. A receiver having an analog equalizer, the equalizer comprising:
    an input and an output;
    a first filter coupled between the input and the output of the equalizer;
    a second filter coupled between the input of the equalizer and a node;

a first amplifier having a first gain, an input coupled to the node, and an output coupled to the output of the equalizer; and a second amplifier having second gain, an input coupled to the node, and an output coupled to the output of the equalizer;

wherein, in a first mode of operation the second gain is substantially zero and the first gain ranges between a maximum gain Km and a gain breakpoint Kb, wherein in a second mode of operation the first gain is substantially the maximum gain and the second gain ranges between the maximum gain Km and the gain breakpoint Kb, wherein the combined gain of the first and second amplifiers applied to a load in the first mode is between Kb and Km and the combined gain in the second mode is between 0 and Kb, and wherein the gain breakpoint Kb is less than the maximum gain Km and greater than zero.

10. The receiver of claim 9, wherein the gain breakpoint Kb is substantially one-half the maximum gain Km.

11. The receiver of claim 9, wherein the output of the second amplifier is coupled to the load in a phase opposite to that of the first amplifier.

12. The receiver of claim 9, wherein the first and second gains are transconductances of the first and second amplifiers, respectively, and the first and second amplifiers each have a differential amplifier responsive to respective first and second tail currents that control the transconductance of the first and second amplifiers, respectively.

13. The receiver of claim 12, wherein the tail currents are digitally controlled.

14. The receiver of claim 9, wherein the load includes a resistor.

15. The receiver of claim 9, wherein the first filter has a unity transfer function and the second filter has a high-pass transfer function.

16. The receiver of claim 9, wherein the first filter has a low-pass transfer function and the second filter has a high-pass transfer function.

17. The receiver of claim 9, further comprising an adjustable gain amplifier disposes between the input of the equalizer and the first and second filters.

18. The receiver of claim 9 wherein the equalizer has differential inputs and outputs, the first and second variable transconductance amplifiers are differential amplifiers, and the load includes two resistors coupled between a voltage supply line and corresponding conductors of the differential output.

19. A method of amplifying a signal in an equalizer, the method comprising the steps of:

amplifying the signal using a first amplifier having a first gain;

amplifying the signal using a second amplifier having second gain; and subtracting the amplified signal from the second amplifier from the amplified signal from the first amplifier and providing an output;

wherein in a first mode of operation the second gain is substantially zero and the first gain ranges between a maximum gain Km and a gain breakpoint Kb, and in a second mode of operation the first gain is substantially the maximum gain and the second gain ranges between the maximum gain Km and the gain breakpoint Kb, and the gain breakpoint Kb is less than the maximum gain Km and greater than zero;

wherein the output is provided to a load.

20. The method of claim 19, wherein the gain breakpoint Kb is approximately one-half the maximum gain Km.

21. The method of claim 19, wherein the first and second gains are first and second transconductances of the first and second amplifiers, respectively, and the first and second amplifiers each have a differential amplifier responsive to respective first and second tail currents that control the transconductance of the first and second amplifiers, respectively.

22. The method of claim 21, wherein the tail currents are digitally controlled.

23. A receiver having an equalizer with an input and an output, the equalizer comprising:

a resistive load coupled to the output of the equalizer;

a first variable transconductance amplifier having a first transconductance, an input coupled to the input of the equalizer, and an output coupled to the output of the equalizer; and a second variable transconductance amplifier having a second transconductance, an input coupled to the input of the equalizer, and an output coupled to the output of the equalizer in a phase opposite to that of the first variable transconductance amplifier;

wherein, in a first mode of operation the second transconductance is substantially zero and the first transconductance ranges between a maximum transconductance Km and a transconductance breakpoint Kb, and in a second mode of operation the first transconductance is substantially equal to the maximum transconductance and the second transconductance ranges between the maximum transconductance Km and the transconductance breakpoint Kb, wherein the combined gain of the first and second transconductance amplifier applied to the load in the first mode is between Kb and Km and the combined gain in the second mode is between 0 and Kb and, and the transconductance breakpoint Kb is sufficient to assure that no substantial nonlinear distortion occurs by the equalizer.

24. The receiver of claim 23, wherein the transconductance breakpoint Kb is substantially one-half the maximum transconductance Km.

25. The receiver of claim 23, wherein the first and second variable transconductance amplifiers each have a differential amplifier responsive to the respective first and second tail currents that control the respective transconductance of the first and second variable transconductance amplifiers.

26. The receiver of claim 23, wherein the tail currents are digitally controlled.

27. The integrated circuit of claim 1 wherein the gain breakpoint Kb is greater than a minimum gain, the minimum gain being sufficient to assure that no substantial nonlinear distortion occurs by the equalizer.

28. The receiver of claim 9 wherein the gain breakpoint Kb is greater than a minimum gain, the minimum gain being sufficient to assure that no substantial nonlinear distortion occurs by the equalizer.

29. The method of claim 19, wherein the gain breakpoint Kb is greater than a minimum gain, the minimum gain being sufficient to assure that no substantial nonlinear distortion occurs in the subtracted amplified signals.

* * * * *